United States Patent
Hwang et al.

(10) Patent No.: US 7,662,711 B2
(45) Date of Patent: Feb. 16, 2010

(54) METHOD OF FORMING DUAL DAMASCENE PATTERN

(75) Inventors: Sang-Il Hwang, Seoul (KR); Hyun Ju Lim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 11/752,625

(22) Filed: May 23, 2007

(65) Prior Publication Data

US 2007/0273027 A1    Nov. 29, 2007

(30) Foreign Application Priority Data

May 24, 2006   (KR) ............... 10-2006-0046606

(51) Int. Cl.
*H01L 21/00* (2006.01)
(52) U.S. Cl. ............... 438/622; 438/597; 438/618; 438/626; 438/636; 438/703; 257/E21.029; 257/E21.253; 257/E21.259; 257/E21.266; 257/E21.579
(58) Field of Classification Search ........... 438/637, 438/597, 618, 622–638, 692–762, 785; 257/E21.029, 257/252–277, 577, 579, 648
See application file for complete search history.

(56) References Cited

U.S. PATENT DOCUMENTS

| | | | | |
|---|---|---|---|---|
| 5,741,626 A | * | 4/1998 | Jain et al. | 430/314 |
| 5,882,996 A | * | 3/1999 | Dai | 438/597 |
| 6,017,817 A | * | 1/2000 | Chung et al. | 438/637 |
| 6,077,769 A | * | 6/2000 | Huang et al. | 438/622 |
| 6,153,514 A | * | 11/2000 | Wang et al. | 438/640 |
| 6,235,628 B1 | * | 5/2001 | Wang et al. | 438/638 |
| 6,251,770 B1 | * | 6/2001 | Uglow et al. | 438/624 |
| 6,265,319 B1 | * | 7/2001 | Jang | 438/723 |
| 6,284,149 B1 | * | 9/2001 | Li et al. | 216/64 |
| 6,309,955 B1 | * | 10/2001 | Subramanian et al. | 438/618 |
| 6,312,874 B1 | * | 11/2001 | Chan et al. | 430/314 |
| 6,319,821 B1 | * | 11/2001 | Liu et al. | 438/636 |
| 6,372,635 B1 | * | 4/2002 | Wang et al. | 438/638 |
| 6,429,119 B1 | * | 8/2002 | Chao et al. | 438/633 |
| 7,129,159 B2 | * | 10/2006 | America et al. | 438/618 |
| 7,439,130 B2 | * | 10/2008 | Park | 438/253 |
| 2004/0121585 A1 | * | 6/2004 | Liu et al. | 438/637 |
| 2005/0104150 A1 | * | 5/2005 | Wetzel et al. | 257/437 |
| 2005/0191840 A1 | * | 9/2005 | Ho et al. | 438/618 |

FOREIGN PATENT DOCUMENTS

KR    1020040057517 A    7/2004

* cited by examiner

*Primary Examiner*—Michael S Lebentritt
(74) *Attorney, Agent, or Firm*—Sherr & Vaughn, PLLC

(57) ABSTRACT

A method of forming a dual damascene pattern for a metal interconnection by a relatively simple process. Only a portion of an interlayer insulating film is initially etched when forming a via hole. When the interlayer insulating is etched to form a trench, the remaining portion of the via hole may be etched simultaneously.

20 Claims, 6 Drawing Sheets

METHOD OF FORMING DUAL DAMASCENE PATTERN

This application claims the benefit of the Korean Patent Application No. 10-2006-0046606, filed on May 24, 2006, which is hereby incorporated by reference in its entirety.

BACKGROUND

Metal interconnections may be used to make electrical connections between devices or between interconnections. Although aluminum (Al) or tungsten (W) may be used for metal interconnections, alternative metallic materials having adequate electrical characteristic may be necessary in highly integrated semiconductor devices, due to the relatively low melting point and/or relatively high specific resistivity of the Al or W. Copper (Cu) is a metallic material having relatively low specific resistivity and/or adequate reliability (e.g. reliable in electromigration and stress migration) for some applications. The melting point of Cu is relatively high at 1080° C. (compared to 660° C. for Al and 3400° C. for W) and the specific resistivity of Cu is relatively low at 1.7 $\mu\Omega$cm (compared to 2.7 $\mu\Omega$cm for Al and 5.6 $\mu\Omega$cm for W). A Cu alloy may also be used as a metal interconnection material instead of pure Cu. A Cu alloy that may be used should have a specific resistivity not much higher than pure Cu and should have adequate reliability and corrosion resistance characteristics.

It may be difficult to form a compound having strong volatility with Cu. Cu may be used in a damascene process, in which a trench (e.g. an interconnection) is formed. A trench may be formed by depositing an interlayer insulating film, etching the insulating film (e.g. through photolithography), filling the trench with Cu, and/or planarizing the Cu (e.g. by chemical mechanical polishing (CMP)). A dual damascene process may form vias and metal interconnections in multilayered interconnection structures.

Example FIGS. 1A through 1G are cross-sectional views illustrating a method of forming a dual damascene interconnection in a semiconductor device. As illustrated in example FIG. 1A, a silicon carbide (SiC) film may be formed as etch stop film 120 over first metal interconnection film 110. First metal interconnection film 110 may be formed in lower insulating film 100. First and second insulating films 130*a* and 130*b* may be sequentially formed over etch stop film 120.

As illustrated in example FIG. 1B, a via hole 140 (which may expose etch stop film 120) may pass through first and second insulating films 130*a* and 130*b*. Via hole 140 may be formed through an etching process using a predetermined mask film pattern (e.g. a photoresist pattern). After via hole 140 has been formed, a mask film pattern may be removed through a stripping process.

As illustrated in example FIG. 1C, a sacrificial film 150 may be formed in via hole 140. Sacrificial film 150 may protect via hole 140 when forming a trench in a subsequent process. A recess process may be performed to remove an upper portion of sacrificial film 150. A Novolac gap-fill material may be used as the sacrificial film 150 and the Novolac gap-fill material may be recessed from a surface of via hole 140 to a predetermined depth.

As illustrated in example FIG. 1D, a mask film pattern 160 may be formed on the surface of second insulating film 130*b*. Trench 170 may be formed through an etching process using mask film pattern 160 as an etching mask.

As illustrated in example FIG. 1E, mask film pattern 160 may be removed through an ashing process. Sacrificial film 150 remaining in via hole 140 may also be removed.

As illustrated in example FIG. 1F, a portion of etch stop film 120 that is exposed through the via hole 140 may be removed. As illustrated in example FIG. 1G, Cu may fill the via hole 140 and trench 170 to form a second metal interconnection film 180. Second metal interconnection film 180 may contact first metal interconnection film 110. Before filling the via hole 140 and the trench 170 with Cu, a barrier metal (e.g. a Ta/TaN film) may be deposited inside via hole 140 and trench 170.

Cu and/or barrier metal formed over a top surface of inter-metal insulating film 130 may be removed through a planarization process (e.g. by planarizing the Cu and/or barrier metal through a CMP process until the inter-metal insulating film 130 is exposed) to form second metal interconnection film 180 connected vertically to first metal interconnection film 110.

However, when forming a metal interconnection using a dual damascene process, a via hole may be protected when etching an overlying trench by a gap-fill material in the via hole. Multiple process may need to be performed to recess the gap-fill material and then fully remove the gap-fill material from the via hole (after the trench is formed). Such multiple processes may make semiconductor fabrication overly complicated.

SUMMARY

Embodiments relate to a method of forming a dual damascene pattern for a metal interconnection by a relatively simple process. In embodiments, only a portion of an interlayer insulating film is initially etched when forming a via hole. When the interlayer insulating is etched to form a trench, the remaining portion of the via hole may be etched simultaneously. Accordingly, in embodiments, semiconductor fabrication may be simplified, as there is no need for processing steps to form and/or remove gap-fill material.

Embodiments relate to a method of forming a dual damascene pattern, including at least one of the following steps. Forming an etch stop film and an interlayer insulating film over a semiconductor substrate, wherein a lower interconnection is formed in or over the semiconductor substrate. Forming a via hole mask film pattern over a surface of the interlayer insulating film, which defines a via hole region. Removing a portion of the interlayer insulating film using the via hole mask film pattern as an etching mask. Removing the via hole mask film pattern. Forming a trench mask film pattern over the interlayer insulating film, which defines a trench region. Simultaneously forming a trench and the remaining portion of the via hole (e.g. until the etch stop film is exposed) in the interlayer insulating film using the trench mask film pattern as an etching mask.

In embodiments, when removing a portion of an interlayer insulating film using the via hole mask film pattern as an etching mask, the depth of the interlayer insulating film that is removed is the depth of the trench that will be formed. In embodiments, an interlayer insulating film includes a first insulating film and a second insulating film. In embodiments, the first insulating film is formed by using black diamond (BD) and/or a material having a dielectric constant less than or equal to approximately 3.0. In embodiments, a second insulating film is formed of a tetra ethyl orthosilicate (TEOS) film and/or an insulating film having a dielectric constant less than or equal to approximately 3.0.

In embodiments, when removing a portion of an interlayer insulating film using a via hole mask film pattern as an etching mask, the interlayer insulating film is partially removed such that the etch stop film is not exposed.

DESCRIPTION OF DRAWINGS

Example

Example

DESCRIPTION

Example FIGS. 2A through 2G are cross-sectional views illustrating a method of fabricating a metal interconnection through formation of a dual damascene pattern, in accordance with embodiments.

Figure 1A:
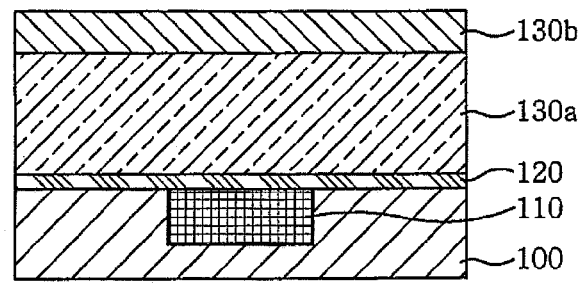
FIGS. 1A through 1G illustrate forming a dual damascene interconnection in a semiconductor device, in accordance with prior art.
Figure 1B:
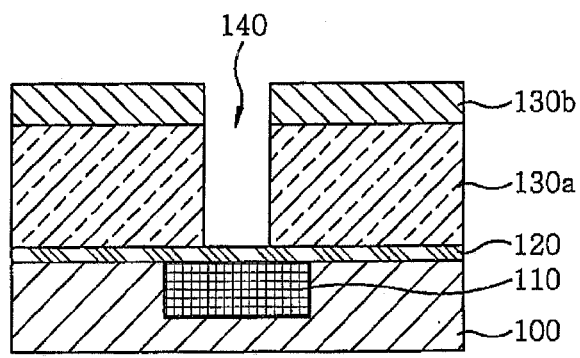
Figure 1C:
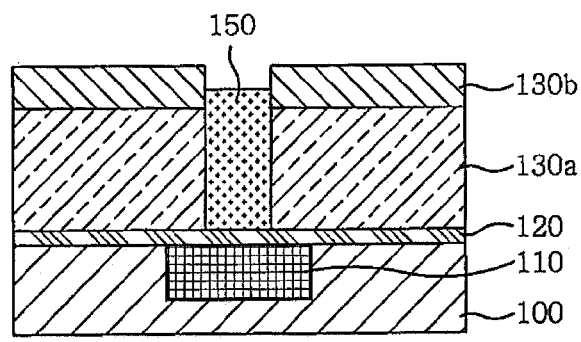
Figure 1D:
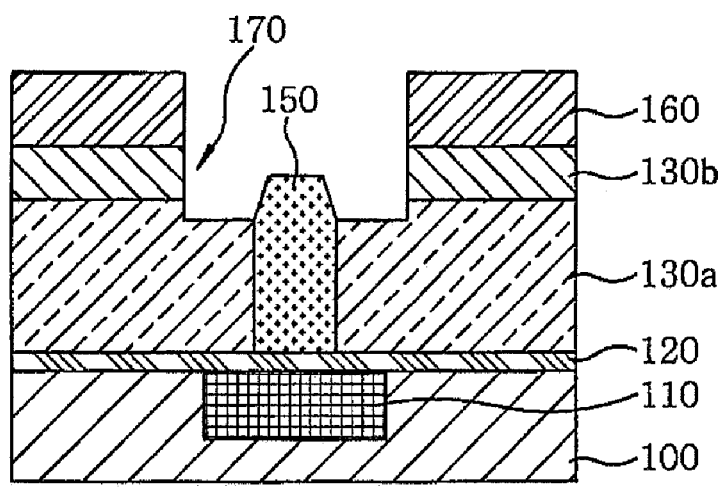
Figure 1E:
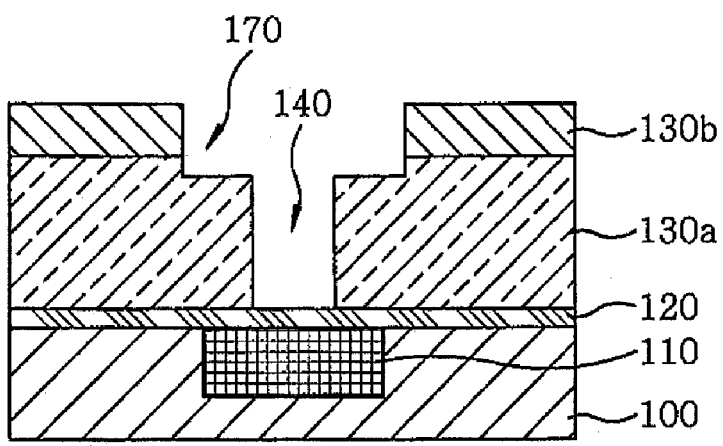
Figure 1F:
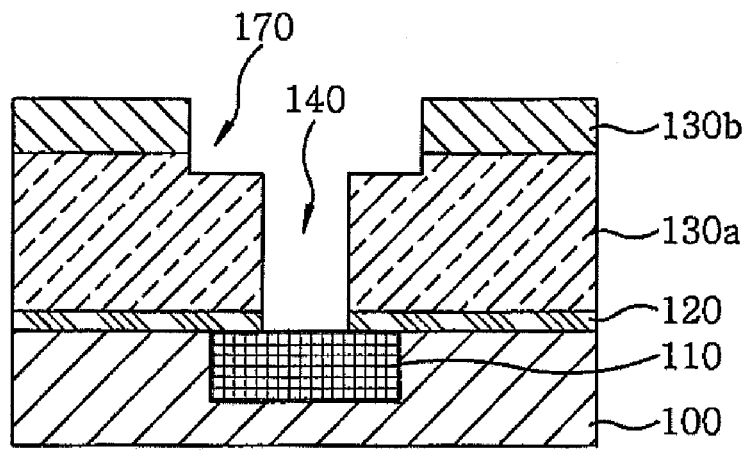
Figure 1G:
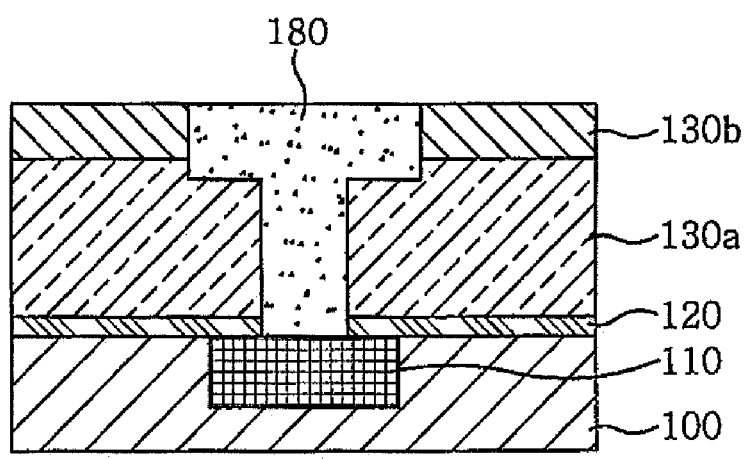
Figure 2A:
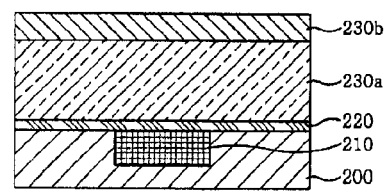
FIGS. 2A through 2G illustrate a method of fabricating a metal interconnection through formation of a dual damascene pattern, in accordance with embodiments.

As illustrated in example FIG. 2A, an etch stop layer (e.g. a silicon carbide (SiC) film) is formed over a first metal interconnection film 210. First metal interconnection film 210 may be formed in a lower insulating film 200. An interlayer film or interlayer films (e.g. first insulating film 230a and second insulating film 230b) may be formed over etch stop film 220. In embodiments, first insulating film 230a may be formed of black diamond (BD) having a relatively low dielectric constant and/or a material having a dielectric constant less than or equal to approximately 3.0. In embodiments, second insulating film 230b may be formed of tetra ethyl orthosilicate (TEOS) having a relatively low dielectric constant and/or a material having a dielectric constant less than or equal to approximately 3.0.

In embodiments, a BD material used to form first insulating film 230a may be a film in which carbon (C) is dropped on a Si oxide film (e.g. serving as a base). In embodiments, a BD material has a dielectric constant of approximately 2.7 and/or solidity stronger than an organic polymer. Accordingly, in embodiments, a BD material may not be significantly influenced by a chemical mechanical polishing (CMP) process during planarization and/or the dielectric constant of the BD material is not significantly altered by the CMP process.

A lower insulating film 200 may be deposited over a lower structure of a semiconductor substrate (e.g. through a process such as chemical vapor deposition (CVD) or similar process). A trench defining a lower interconnection region may be formed by dry or wet etching lower insulating film 200. Copper (Cu) (or similar material) may fill the trench through at least one of electroplating, physical vapor deposition (PVD) and/or other similar process. First metal interconnection film 210 may be formed by planarizing the Cu through a CMP process and/or similar planarizing process.

Figure 2B:
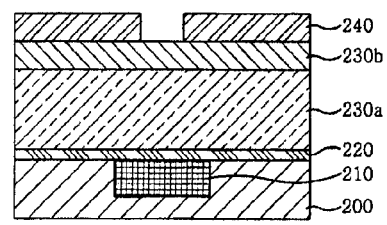
Figure 2C:
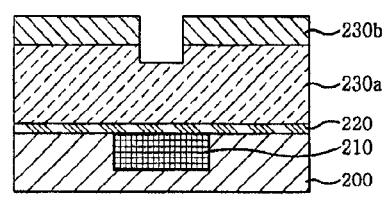

As illustrated in example FIG. 2B, a via hole mask film 240 may be formed over second insulating film 230b, in accordance with embodiments. Via hole mask film 240 may be patterned to define a via hole. As illustrated in example FIG. 2C, a first portion of a via hole may be formed in a second insulating film 230b and first insulating film 230a, in accordance with embodiments. The first portion of the via hole may be formed by etching the second insulating film 230b and the first insulating film 230a using the via hole mask film 240 as an etch mask.

In accordance with embodiments, etching the first portion of the via hole may include a dry etching process (e.g. a reactive ion etching (RIE)). In embodiments, the first portion of the via hole may include the entire depth of the second insulating film 230b. In embodiments, the first portion of the via may include only a portion of the depth of the first insulating film 230a, such that the etch stop film 220 is not exposed by the first portion of the via.

In embodiments, the total depth of the first insulating film 230a and the second insulating film 230b (that are removed together in one etching process using the via hole mask film 240 as an etch mask) is approximately the same as the depth of the trench to be formed.

In embodiments, the total depth of the first insulating film 230a and the second insulating film 230b that remain in the via hole area (after etching using the via hole mask film 240 as an etch mask) is less than or equal to the depth of the trench to be formed.

In embodiments, after the first portion of the via hole is etched, the via hole mask film pattern 240 may be removed (e.g. through an ashing process). In embodiments, a first etching process that uses the via hole mask film pattern 240 only etches part of the depth of the first insulating film 230a, such that an underlying film (e.g. the etch stop film 220) is not exposed. Accordingly, gap-fill material and recess processes of a Novolac material may not be necessary, in accordance with embodiments. In embodiments, the via hole mask film pattern 240 is relatively thin (e.g. because only a portion of the first insulating film 230a is etched).

Figure 2D:
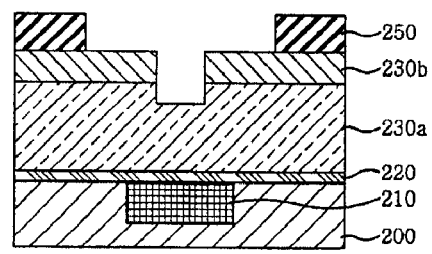

As illustrated in example FIG. 2D, a trench mask film pattern 250 may be formed over the second insulating film 230b, in accordance with embodiments. In embodiments, when the trench mask film pattern 250 is formed, the via hole is only partially etched.

Figure 2E:
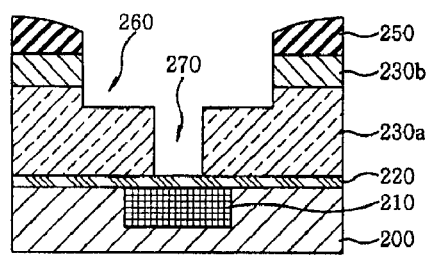

As illustrated in example FIG. 2E, the second insulating film 230b (that may be exposed by the trench mask film pattern 250) may be etched using the trench mask film pattern 250 as an etch mask, in accordance with embodiments. In embodiments, the entire depth of the second insulating film 230b is etched when using the trench mask film pattern 250 as an etch mask. In embodiments, a portion of the depth of the first insulating film 230b that is exposed by the trench mask film pattern 250 is etched, using trench mask film pattern 250 as an etch mask. However, the entire depth of the first insulating film 230a that forms a via hole is etched when using the trench mask film pattern as an etch mask, in accordance with embodiments.

In other words, according to embodiments, the portion of the first insulating film 230a that was etched using both the via hole mask film pattern 240 and the trench mask film pattern 25 (i.e. via hole region) is etched through the full depth of the first insulating film 230a (e.g. exposing etch stop layer 220). However, according to embodiments, only part of the depth of the first insulating film 230a that was only etched using the trench mask film pattern 250 (i.e. the trench region that does not overlap the via hole region) is etched. Accordingly, trench 260 and via hole 270 are formed simultaneously in a second etching process.

In embodiments, etching using the trench mask film pattern 250 may be a dry etching process (e.g. RIE).

Figure 2F:
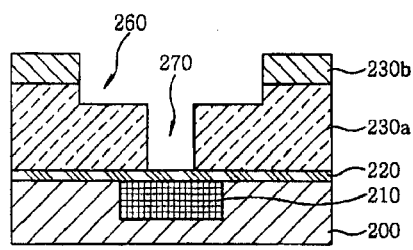

As illustrated in example FIG. 2F, the trench mask film pattern 250 may be removed (e.g. by an ashing process).

Figure 2G:
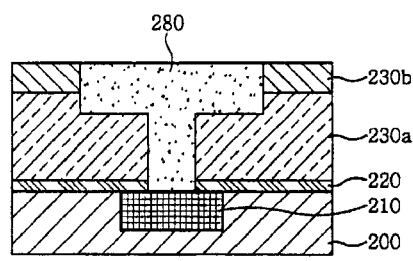

As illustrated in example FIG. 2G, etch stop film 220 exposed through via hole 270 may be removed, in accordance with embodiments. Cu may be filled in via hole 270 and trench 260 to form a second metal interconnection film 280. Second metal interconnection film 280 may contact first metal interconnection film 210. In embodiments, Cu may be formed using an electroless plating or electroplating method. In embodiments, a barrier metal layer may be deposited in via hole 270 and trench 260 prior to being filled with Cu. In embodiments, a barrier metal (e.g. Ta/TaN) may be relatively thin.

In embodiments, Cu (and the barrier metal, if applicable) formed over the top surface of second insulating film 230b may be removed through a planarization process (e.g. by planarizing the Cu (and the barrier metal, if applicable) through a CMP process until the second insulating film 230*b* is exposed) to form metal interconnection film 280.

In embodiments, when etching the insulating films corresponding to the via hole region using the via hole mask film pattern, parts of the insulating films are etched, so that subsequent gap-fill and recess processes of a Novolac material may not be necessary.

In embodiments, when etching insulating films corresponding to a via hole region using a via hole mask film pattern, parts of the insulating films are etched, so that subsequent gap-fill and recess processes of a Novolac material may not be necessary, thereby simplifying a semiconductor fabrication process.

In embodiments, since only parts of insulating films in a via hole region are etched using the via hole mask film pattern, the via hole mask film pattern may be relatively thin.

While embodiments have been shown and described, it will be understood by those skilled in the art that various changes and modifications may be made without departing from the scope of the invention as defined in the following claims.

What is claimed is:

1. A method comprising:
   forming an etch stop film over and directly contacting a metal interconnection film in a semiconductor substrate;
   forming an interlayer insulating film over the etch stop layer;
   forming a via hole mask film pattern over the interlayer insulating film;
   removing a first portion of the interlayer insulating film using the via hole mask film pattern as an etching mask, wherein the first portion of the interlayer insulating film is a first part of a via hole;
   removing the via hole mask film pattern;
   forming a trench mask film pattern over the interlayer insulating film;
   simultaneously forming a trench and a second part of the via hole in the interlayer insulating film using the trench mask film pattern as an etching mask, wherein the second part of the via hole exposes the etch stop film; and
   removing the trench mask film pattern.

2. The method of claim 1, wherein the method is a method of forming a dual damascene pattern.

3. The method of claim 1, comprising forming a lower interconnection, wherein the etch stop layer is formed over the lower interconnection.

4. The method of claim 1, wherein the depth of the first part of the via hole is the depth of the trench.

5. The method of claim 1, wherein the depth of the first part of the via hole is greater than the depth of the trench.

6. The method of claim 1, wherein the interlayer insulating film comprises a first insulating film and a second insulating film.

7. The method of claim 6, wherein the first insulating film comprises at least one of black diamond (BD) and a material having a dielectric constant less than or equal to approximately 3.0.

8. The method of claim 6, wherein the second insulating film comprises at least one of a tetra ethyl orthosilicate (TEOS) material or material having a dielectric constant less than or equal to approximately 3.0.

9. The method of claim 1, comprising filling the trench and the via hole with a conductive material.

10. The method of claim 9, comprising depositing a barrier layer on the surfaces of the via hole and the trench prior to said filling the trench and the via hole.

11. An apparatus comprising:
    an etch stop film formed over and directly contacting a metal interconnection film in a semiconductor substrate;
    an interlayer insulating film formed over the etch stop layer; and
    a trench and a via hole formed in the interlayer insulating film, wherein the trench and the via hole are formed by:
       forming a via hole mask film pattern over the interlayer insulating film,
       removing a first portion of the interlayer insulating film using the via hole mask film pattern as an etching mask, wherein the first portion of the interlayer insulating film is a first part of the via hole,
       removing the via hole mask film pattern,
       forming a trench mask film pattern over the interlayer insulating film,
       simultaneously forming the trench and a second part of the via hole in the interlayer insulating film using the trench mask film pattern as an etching mask, wherein the second part of the via hole exposes the etch stop film, and
       removing the trench mask film pattern.

12. The apparatus of claim 11, wherein the via and the trench form a dual damascene pattern.

13. The apparatus of claim 11, comprising a lower interconnection, wherein the etch stop layer is formed over the lower interconnection.

14. The apparatus of claim 11, wherein the depth of the first part of the via hole is the depth of the trench.

15. The apparatus of claim 11, wherein the depth of the first part of the via hole is greater than the depth of the trench.

16. The apparatus of claim 11, wherein the interlayer insulating film comprises a first insulating film and a second insulating film.

17. The apparatus of claim 16, wherein the first insulating film comprises at least one of black diamond (BD) and a material having a dielectric constant less than or equal to approximately 3.0.

18. The apparatus of claim 16, wherein the second insulating film comprises at least one of a tetra ethyl orthosilicate (TEOS) material or material having a dielectric constant less than or equal to approximately 3.0.

19. The apparatus of claim 11, wherein the trench and the via hole are filled with a conductive material.

20. The method of claim 9, wherein a barrier layer is formed on the surfaces of the via hole and the trench.

* * * * *